United States Patent
Konradsson et al.

(10) Patent No.: US 10,840,921 B2
(45) Date of Patent: Nov. 17, 2020

(54) FREQUENCY CONTROL WORD LINEARIZATION FOR AN OSCILLATOR

(71) Applicant: Innophase, Inc., San Diego, CA (US)

(72) Inventors: Per Konradsson, Järfälla (SE); Yang Xu, San Diego, CA (US); Sara Munoz Hermoso, San Diego, CA (US)

(73) Assignee: INNOPHASE INC., San Diego, CA (US)

( * ) Notice: Subject to any disclaimer, the term of this patent is extended or adjusted under 35 U.S.C. 154(b) by 0 days.

(21) Appl. No.: 16/125,510

(22) Filed: Sep. 7, 2018

(65) Prior Publication Data
US 2020/0083893 A1 Mar. 12, 2020

(51) Int. Cl.
*H03L 7/099* (2006.01)
*H03L 7/093* (2006.01)
*H03B 5/12* (2006.01)

(52) U.S. Cl.
CPC ......... *H03L 7/0991* (2013.01); *H03B 5/1212* (2013.01); *H03L 7/093* (2013.01); *H03B 2200/005* (2013.01); *H03B 2201/0208* (2013.01); *H03L 2207/50* (2013.01)

(58) Field of Classification Search
CPC .................................................. H03L 7/0991
USPC ........................................................... 331/8
See application file for complete search history.

(56) References Cited

U.S. PATENT DOCUMENTS

| | | | |
|---|---|---|---|
| 4,271,412 A | 6/1981 | Glass | |
| 4,322,819 A | 3/1982 | Hyatt | |
| 5,325,095 A | 6/1994 | Vadnais | |
| 5,493,581 A | 2/1996 | Young | |
| 5,635,864 A | 6/1997 | Jones | |
| 6,161,420 A | 12/2000 | Dilger | |
| 6,369,659 B1 | 4/2002 | Delzer | |

(Continued)

FOREIGN PATENT DOCUMENTS

| | | |
|---|---|---|
| EP | 1187313 | 3/2002 |
| EP | 1187313 | 2/2008 |

(Continued)

OTHER PUBLICATIONS

He, Xin and Kuhn, William B. "A Fully Integrated Q-enhanced LC Filter with 6dB Noise Figure at 2.5 GHz in SOI" 2004 IEEE Radio Frequency Integrated Circuits Symposium, pp. 643-646 (4 pages).

(Continued)

*Primary Examiner* — Joseph Chang
(74) *Attorney, Agent, or Firm* — Invention Mine LLC

(57) ABSTRACT

A method and circuit for linearizing a frequency response of an oscillator controlled by a plurality of capacitor banks are disclosed. In the disclosed method, for each capacitor bank of at least two capacitor banks of the oscillator, a respective sensitivity characteristic of the capacitor bank is determined. Further, a set of reference output frequency control words (FCWs) for an associated set of frequencies of the oscillator are determined. When an input FCW is received and an output FCW is responsively provided based on (i) an interpolation between two reference output FCWs of the set of reference output FCWs and (ii) the respective sensitivity characteristics of the at least two capacitor banks of the oscillator. The output FCW is then applied to the at least two capacitor banks of the oscillator.

19 Claims, 11 Drawing Sheets

(56) References Cited

U.S. PATENT DOCUMENTS

| | | |
|---|---|---|
| 6,373,337 B1 | 4/2002 | Ganser |
| 6,556,636 B1 | 4/2003 | Takagi |
| 6,587,187 B2 | 7/2003 | Watanabe |
| 6,975,165 B2 | 12/2005 | LopezVillegas |
| 7,042,958 B2 | 5/2006 | Biedka |
| 7,095,274 B2 | 8/2006 | LopezVillegas |
| 7,193,462 B2 | 3/2007 | Braithwaite |
| 7,313,198 B2 | 12/2007 | Rahman et al. |
| 7,332,973 B2 | 2/2008 | Lee |
| 7,400,203 B2 | 7/2008 | Ojo |
| 7,447,272 B2 | 11/2008 | Haglan |
| 7,564,929 B2 | 7/2009 | LopezVillegas |
| 7,602,244 B1 | 10/2009 | Holmes |
| 7,773,713 B2 | 8/2010 | Cafaro |
| 7,888,973 B1 | 2/2011 | Rezzi |
| 8,314,653 B1 | 11/2012 | Granger-Jones |
| 8,368,477 B2 | 2/2013 | Moon |
| 8,421,661 B1 | 4/2013 | Jee |
| 8,498,601 B2 | 7/2013 | Horng |
| 8,666,325 B2 | 3/2014 | Shute |
| 8,804,875 B1 | 8/2014 | Xu |
| 8,854,091 B2 | 10/2014 | Hossain |
| 8,929,486 B2 | 1/2015 | Xu et al. |
| 8,941,441 B2 | 1/2015 | Testi |
| 9,024,696 B2 | 5/2015 | Li et al. |
| 9,083,588 B1 | 7/2015 | Xu |
| 9,178,691 B2 | 11/2015 | Shimizu |
| 9,240,914 B2 | 1/2016 | Yao |
| 9,391,625 B1 | 7/2016 | Xu et al. |
| 9,479,177 B1 | 10/2016 | Buell et al. |
| 9,497,055 B2 | 11/2016 | Xu |
| 9,519,035 B2 | 12/2016 | Ramirez |
| 9,673,828 B1 | 6/2017 | Xu |
| 9,673,829 B1 | 6/2017 | Xu |
| 9,813,011 B2 | 11/2017 | Despesse |
| 9,813,033 B2 | 11/2017 | Testi et al. |
| 9,819,524 B2 | 11/2017 | Khoury et al. |
| 9,985,638 B2 | 5/2018 | Xu et al. |
| 10,122,397 B2 | 11/2018 | Xu et al. |
| 10,148,230 B2 | 12/2018 | Xu et al. |
| 10,158,509 B2 | 12/2018 | Xu et al. |
| 10,320,403 B2 | 6/2019 | Xu et al. |
| 2001/0001616 A1 | 5/2001 | Rakib |
| 2002/0048326 A1 | 4/2002 | Sahlman |
| 2002/0132597 A1 | 9/2002 | Peterzell |
| 2003/0053554 A1 | 3/2003 | McCrokle |
| 2003/0058036 A1 | 3/2003 | Stillman et al. |
| 2003/0142002 A1 | 7/2003 | Winner et al. |
| 2003/0174783 A1 | 9/2003 | Rahman et al. |
| 2004/0036538 A1 | 2/2004 | Devries |
| 2004/0100330 A1 | 5/2004 | Chandler |
| 2004/0146118 A1 | 7/2004 | Talwalkar et al. |
| 2005/0285541 A1 | 12/2005 | LeChevalier |
| 2006/0078079 A1 | 4/2006 | Lu |
| 2006/0145762 A1 | 7/2006 | Leete |
| 2006/0193401 A1 | 8/2006 | Lopez Villegas |
| 2006/0222109 A1 | 10/2006 | Watanabe et al. |
| 2006/0285541 A1 | 12/2006 | Roy |
| 2007/0132511 A1 | 6/2007 | Ryynanen |
| 2008/0079497 A1 | 4/2008 | Fang |
| 2008/0112526 A1 | 5/2008 | Yi |
| 2008/0150645 A1 | 6/2008 | McCorquodale |
| 2008/0170552 A1 | 7/2008 | Zaks |
| 2008/0192872 A1 | 8/2008 | Lindoff |
| 2008/0192877 A1 | 8/2008 | Eliezer |
| 2008/0205709 A1 | 8/2008 | Masuda |
| 2008/0211576 A1 | 9/2008 | Moffatt |
| 2008/0220735 A1 | 9/2008 | Kim |
| 2008/0225981 A1 | 9/2008 | Reddy |
| 2008/0225984 A1 | 9/2008 | Ahmed |
| 2008/0291064 A1 | 11/2008 | Johansson |
| 2009/0153244 A1 | 6/2009 | Cabanillas |
| 2009/0256601 A1 | 10/2009 | Zhang et al. |
| 2009/0295493 A1 | 12/2009 | Lee et al. |
| 2009/0302908 A1 | 12/2009 | Nakamura |
| 2010/0303047 A1 | 12/2010 | Ibrahim et al. |
| 2011/0003571 A1 | 1/2011 | Park |
| 2011/0019657 A1 | 1/2011 | Zaher |
| 2011/0050296 A1 | 3/2011 | Fagg |
| 2011/0159877 A1 | 6/2011 | Kenington |
| 2011/0260790 A1 | 10/2011 | Haddad |
| 2011/0298557 A1 | 12/2011 | Kobayashi |
| 2011/0299632 A1 | 12/2011 | Mirzaei |
| 2011/0300885 A1 | 12/2011 | Darabi |
| 2012/0032718 A1 | 2/2012 | Chan et al. |
| 2012/0074990 A1 | 3/2012 | Sornin |
| 2012/0256693 A1 | 10/2012 | Raghunathan |
| 2012/0306547 A1 | 12/2012 | Arora |
| 2013/0143509 A1 | 6/2013 | Horng |
| 2013/0257494 A1 | 10/2013 | Nikaeen |
| 2014/0023163 A1 | 1/2014 | Xu |
| 2014/0133528 A1 | 5/2014 | Noest |
| 2014/0185723 A1 | 7/2014 | Belitzer |
| 2014/0266480 A1 | 9/2014 | Li et al. |
| 2014/0269999 A1 | 9/2014 | Cui |
| 2014/0270003 A1 | 9/2014 | Xu et al. |
| 2014/0321479 A1 | 10/2014 | Zhang et al. |
| 2015/0180685 A1 | 6/2015 | Noest |
| 2015/0207499 A1 | 7/2015 | Horng |
| 2015/0229318 A1 | 8/2015 | Tamura et al. |
| 2016/0139568 A1 | 5/2016 | Schimper |
| 2016/0155558 A1 | 6/2016 | Groves |
| 2016/0169717 A1 | 6/2016 | Zhitomirsky |
| 2017/0085405 A1 | 3/2017 | Xu |
| 2017/0163272 A1 | 6/2017 | Xu |
| 2017/0187364 A1 | 6/2017 | Park et al. |
| 2017/0194973 A1* | 7/2017 | Moehlmann .............. G01S 7/35 |
| 2018/0196972 A1 | 7/2018 | Lu et al. |
| 2018/0205384 A1 | 7/2018 | Lee |
| 2018/0287646 A1 | 10/2018 | Xu et al. |
| 2019/0059055 A1 | 2/2019 | Murali |
| 2020/0083857 A1 | 3/2020 | Testi et al. |

FOREIGN PATENT DOCUMENTS

| | | |
|---|---|---|
| JP | 07221570 | 8/1995 |
| JP | 11088064 | 3/1999 |
| KR | 20150007728 A | 1/2015 |
| WO | 2005078921 A2 | 8/2005 |
| WO | 2005078921 A3 | 4/2006 |
| WO | 2012132847 | 4/2012 |

OTHER PUBLICATIONS

International Search Report and Written Opinion for PCT/US2014/026459 dated Jul. 28, 2014 (10 pages).

International Search Report and Written Opinion for PCT/US2014/030525 dated Jul. 24, 2014. (16 pages).

Chi-Tsan Chen et al., Wireless Polar Receiver Using Two Injection-Locked Oscillator Stages for Green Radios, IEEE MTT-S International, Jun. 2011. (4 pages).

International Search Report for PCT/US2013/024159 dated Apr. 9, 2013 (1 page).

Rategh, H.R. & Lee, T.H.. (1998), "Superharmonic injection locked oscillators as low power frequency dividers", 132-135. 10.1109/VLSIC.1998.688031. (4 pages).

Jose Maria Lopez-Villegas et al., BPSK to ASK Signal Conversion Using Injection-Locked Oscillators—Part I: Theory, Dec. 2005, IEEE Transactions on Microwave Theory and Techniques, vol. 53, No. 12, pp. 3757-3766 (10 pages).

Behzad Razavi, "A Study of Injection Pulling and Locking in Oscillators", Electrical Engineering Department, University of California, 2003, IEEE, Custom Integrated Circuits Conference. pp. 305-312 (8 pages).

N. Siripon, et al., Novel Sub-Harmonic Injection-Locked Balanced Oscillator, Microwave and Systems Research Group (MSRG), School of Electronics, Computing and Mathematics, University of Surrey, Sep. 24, 2011, 31st European Microwave Conference. (4 pages).

Marc Tiebout, "A 50GHz Direct Injection Locked Oscillator Topology as Low Power Frequency Divider in 0.13 μm CMOS", Infineon

(56) References Cited

OTHER PUBLICATIONS

Technologies AG, Solid-State Circuits Conference, 2003, pp. 73-76, 29th European ESSCIRC. (4 pages).
Henzler, S., "Time-to_Digital Converters", Springer Series in Advanced Microelectronics 29, DOI, 10.1007/978-90-481-8628-0_2, copyright Springer Science+Business Media B.V. 2010, Chapter 2, pp. 5-19 (15 pages).
Pei-Kang Tsai, et al., "Wideband Injection-Locked Divide-by-3 Frequency Divider Design with Regenerative Second-Harmonic Feedback Technique", RF@CAD Laboratory, Department of Electrical Engineering, National Cheng Kung University, Tainan, Taiwan. Mar. 21, 2013 (4 pages).
Nazari, et al., "Polar Quantizer for Wireless Receivers: Theory, Analysis, and CMOS Implementation", IEEE Transactions on Cricuits and Systems, vol. 61, No. 3, Mar. 2014. pp. 1-81 (94 pages).
Lin, et al., "Single-Stage Vernier Time-to-Digital Converter with Sub-Gate Delay Time Resolution", Circuits and Systems, 2011, 2, 365-371, Oct. 2011. pp. 365-371 (7 pages).
Jovanovic, et al., "Vernier's Delay Line Time-to-Digital Converter", Scientific Publications of the State University of Novi Pazar, Ser. A: Appl. Math. Inform. And Mech., vol. 1, 1 (2009), pp. 11-20. (7 pages).
Effendrik, P., "Time-to-Digital Converter (TDC) for WiMAX ADPLL in State-of-The-Art 40-nm CMOS", MSc Thesis, Apr. 18, 2011, 80 pages.
Dudek, et al., "A High-Resolution CMOS Time-to-Digital Converter Utilizing a Vernier Delay Line", IEEE Transactions on Solid-State Circuits, vol. 35, No. 2, Feb. 2000. pp. 240-247 (8 pages).
Jose Maria Lopez-Villegas et al., BPSK to ASK Signal Conversion Using Injection-Locked Oscillators—Part I: Theory, Dec. 2005, IEEE Transactions on Microwave Theory and Techniques, vol. 53, No. 12, available online at: http://diposit.ub.edu/dspace/bitstream/2445/8751/1/529612.pdf.
Hamid R. Rategh, et al., Superharmonic Injection Locked Oscillators as Low Power Frequency Dividers, Stanford University, Stanford, California, IEEE Jun. 13, 1998 (4 pages).
Pei-Kang Tsai, et al., Wideband Injection-Locked Divide-by-3 Frequency Divider Design with Regenerative Second-Harmonic Feedback Technique, RF@CAD Laboratory, Department of Electrical Engineering, National Cheng Kung University, Tainan, Taiwan 2009. (4 pages).
Marc Tiebout, A 50GHz Direct Injection Locked Oscillator Topology as Low Power Frequency Divider in 0.13 µm CMOS, Infineon Technologies AG, Solid-State Circuits Conference, 2003, pp. 73-76, (4 pages), 29th European ESSCIRC.
Hewlett Packard, Phase Noise Characterization of Microwave Oscillators, Frequency Discriminator Method, Sep. 1985, USA (45 pages).
Paul O'Brien, et al.; Analog Devices Raheen Business Park Limerick Ireland paul-p.. "A Comparison of Two Delay Line Discriminator Implementations for Low Cost Phase Noise Measurement." (2010). pp. 1-11 (11 pages).
International Search Report and Written Opinion for PCT/US2014/029055 dated Sep. 15, 2014 (12 pages).
Aeroflex, Application Note, Measurement of Frequency Stability and Phase Noise, Feb. 2007, part No. 46891/865 (8 pages).
Electronic Warfare and Radar Systems Engineering Handbook, Mixers and Frequency Discriminators, Section 6-8.1 to 6-8.2, Apr. 1, 1999, Naval Air Systems Command and Naval Air Warfare Center, USA (299 pages).
Notification of Transmittal of the International Search Report and the Written Opinion of the International Searching Authority, or the Declaration, for PCT/US16/53484, dated Dec. 19, 2016, 8 pages.
Claude Frantz, Frequency Discriminator, published 1994, pp. 1-7 (7 pages).
Chi-Tsan Chen, Cognitive Polar Receiver Using Two Injection-Locked Oscillator Stages, IEEE Transactions on Microwave Theory and Techniques, vol. 59, No. 12, Dec. 2011, pp. 3483-3493 (10 pages).

Jianjun Yu and Fa Foster Dai, "A 3-Dimensional Vernier Ring Time-to-digital Converter in 0.13µm CMOS", Electrical and Computer Engineering, Auburn University, Auburn, AL 36849, USA, Sep. 19, 2010 (4 pages).
Putnam, William, and Julius Smith, "Design of fractional delay filters using convex optimization" (1997 IEEE ASSP Workshop on Applications of Signal Processing to Audio and Acoustics). (4 pages).
Notification of Transmittal of the International Search Report and the Written Opinion of the International Search Authority, or the Declaration, for PCT/US16/64772 dated Feb. 28, 2017, 7 pages.
Dongyi Liao, et al., "An 802.11a/b/g/n Digital Fractional-N PLL With Automatic TDC Linearity Calibration for Spur Cancellation", IEEE Journal of Solid-State Circuits, 0018-9200 0 2017 IEEE.; Jan. 16, 2017 (11 pages).
Antonio Liscidini, Luca Vercesi, and Rinaldo Castello, "Time to Digital Converter based on a 2-dimensions Vernier architecture", University of Pavia Via Ferrata 1, 27100 Pavia, Italy; Sep. 13, 2009 (4 pages).
Renaldi Winoto, et al. "A 2×2 WLAN and Bluetooth Combo SoC in 28nm CMOS with On-Chip WLAN Digital Power Amplifier, Integrated 2G/BT SP3T Switch and BT Pulling Cancelation", ISSCC 2016 / Session 9 / High-Performance Wireless / 9.4, 2016 IEEE International Solid-State Circuits Conference; Feb. 2, 2016, pp. 170-172 (3 pages).
Ahmad Mirzaei, et al, Multi-Phase Injection Widens Lock Range of Ring-Oscillator-Based Frequency Dividers, IEEE Journal of Solid-State Circuits, vol. 43, No. 3, March 2008, pp. 656-671 (16 pages).
William Putnam , Julius Smith, "Design of Fractional Delay Filters Using Convex Optimization", Department of Electrical Engineering and, Center for Research in Music and Acoustics (CCRMA), Stanford University, Stanford, CA 94305-8180; Oct. 1997 (4 pages).
Jun-Chau Chien, et al, Analysis and Design of Wideband Injection-Locked Ring Oscillators With Multiple-Input Injection, EEE Journal of Solid-State Circuits, vol. 42, No. 9, Sep. 2007, pp. 1906-1915 (10 pages).
William Putnam, Julius Smith, "Design of Fractional Delay Filters Using Convex Optimization", Department of Electrical Engineering and Center for Research in Music and Acoustics (CCRMA) Stanford University Stanford, CA 94305-8180. Published in IEEE: workshop on applications of signal processing to audio and acoustics; Oct. 1997 (4 pages).
Stefano Pellerano, at al. "A4.75-GHz Fractional Frequency Divider-by-1.25 With TDC-Based All-Digital Spur Calibration in 45-nm CMOS", 3422 IEEE Journal of Solid-State Circuits, vol. 44, No. 12, Dec. 2009, pp. 3422-3433 (12 pages).
Notification of Transmittal of the International Preliminary Report on Patentability and the Written Opinion of the International Search Authority, or the Declaration, for PCT/US16/64772 dated Jun. 14, 2018, Written Opinion dated Feb. 28, 2017, 7 pages.
Notification of Transmittal of the International Search Report and the Written Opinion of the International Searching Authority, or the declaration for PCT/US2013/024159 dated Apr. 9, 2013 (8 pages).
International Search report and Written Opinion for PCT/US18/27222 dated Jun. 28, 2018 (6 pages).
Darvishi, Milad & Van der Zee, Ronan & Klumperink, Eric & Nauta, Bram. (2012). "A 0.3-to-1.2GHz tunable 4th-order switched gmC bandpass filter with >55dB ultimate rejection and out-of-band IIP3 of +29dBm". American Journal of Physics—Amer J Phys. 55. pp. 358-360 (3 pages) 10.1109/ISSCC.2012.6177050.
Robert F. Wiser, Masoud Zargari, David K. Su, Bruce A. Wooley, "A 5-GHz Wireless LAN Transmitter with Integrated Tunable High-Q RF Filter", Solid-State Circuits IEEE Journal of, vol. 44, No. 8, pp. 2114-2125 (12 pages), 2009.
Rafael Betancourt-Zamora, et al; "1-GHz and 2.8-GHz CMOS injection-locked ring oscillator prescalers"; Allen Center for Integrated Systems, Stanford University; Conference Paper • Feb. 2001, (5 pages).
Cheng, Jiao et al. 9.6 "A 1.3mW 0.6V WBAN-compatible sub-sampling PSK receiver in 65nm CMOS." 2014 IEEE International Solid-State Circuits Conference Digest of Technical Papers (ISSCC) (2014): pp. 168-169 (3 pages).

(56) References Cited

OTHER PUBLICATIONS

He, Xin & B. Kuhn, William. (2005). A2.5-GHz low-power, high dynamic range, self-tuned Q-enhanced LC filter in SOI. Solid-State Circuits, IEEE Journal of. 40. 1618-1628 (11 pages) 10.1109/JSSC.2005.852043.

Li, Dandan and Tsividis, Yannis; "Design techniques for automatically tuned integrated gigahertz-range active LC filters", IEEE Journal of Solid-State Circuits, vol. 37, No. 8, pp. 967-977 (11 pages), Aug. 2002.

Testi, Nicolo et al. "A 2.4GHz 72dB-variable-gain 100dB-DR 7.8mW 4th-order tunable Q-enhanced LC band-pass filter." 2015 IEEE Radio Frequency Integrated Circuits Symposium (RFIC) (2015): 87-90 (4 pages).

Ross, Andrew; "Power Save Issues in WLAN"; Silex Technology America, Inc.; 2014; (35 pages).

Buckel, Tobias, et al., "A Highly Reconfigurable RF-DPLL Phase Modulator for Polar Transmitters in Cellular RFICs", IEEE Transactions on Microwave Theory and Techniques, vol. 66, No. 6, Jun. 2018, 2618-2627 (10 pages).

Markulic, Nereo , et al., "A self-calibrated 10Mb/s phase modulator with -37.4dB EVM based on a 10.1-to-12.4GHz, -246.6dB-FOM, fractional-n subsampling PLL", IEEE International Solid-State Circuits Conference (ISSCC), San Francisco, Session 9.7, 2016, 176-178 (3 pages).

International Preliminary Report on Patentability for PCT/US2018/027222 completed Apr. 4, 2019, Jun. 20, 2019, 1-3 (3 pages).

Marzin, Giovanni, et al., "A 20Mb/s Phase Modulator Based on a 3.6GHz Digital PLL with -36dB EVM at 5 mW Power", IEEE International Solid-State Circuits Conference, vol. 47, No. 12, Dec. 2012, 2974-2988 (15 pages).

International Search Report and Written Opinion for PCT/US2019/049493, dated Apr. 29, 2020, 1-10 (10 pages).

International Search Report and Written Opinion for PCT/US2019/067237, dated Apr. 24, 2020, 1-14 (14 pages).

International Search Report and Written Opinion for PCT/US2019/057432, dated Apr. 6, 2020, 1-9 (9 pages).

Li, Xiaoyong, et al., "20-Mb/s GFSK Modulator Based on 3.6-GHz Hybrid PLL with 3-b DCO Nonlinearity Calibration and Independent Delay Mismatch Control", IEEE Transactions on Microwave Theory and Techniques, vol. 65, No. 7, Jul. 2017, 2387-2398 (12 pages).

\* cited by examiner

| DESIRED FREQUENCY (HZ) | INITIAL FCW (E.G., 18-bit FCW) | REFERENCE OUTPUT FCW (E.G., 18 bit FCW) |
|---|---|---|
| $F_1$ | INITIAL FCW1 | REFERENCE OUTPUT FCW1 |
| $F_2$ | INITIAL FCW2 | REFERENCE OUTPUT FCW2 |
| ... | ... | ... |
| $F_N$ | INITIAL FCW$_N$ | REFERENCE OUTPUT FCW$_N$ |

FIG. 7

FREQUENCY CONTROL WORD LINEARIZATION FOR AN OSCILLATOR

BACKGROUND OF THE INVENTION

In general, in a polar-type digital transmitter, phase signals φ(t) in the range of [−π, π) (or equivalently (0, 2π]) are phase-modulated onto a radio frequency (RF) carrier. To accomplish this, the polar transmitter circuit may include a digitally-controlled oscillator (DCO) which may be, for example, directly phase modulated. In this regard, the phase signals may be processed accordingly to obtain corresponding (instantaneous) digital frequency values in the form of digital control signals that may be used to digitally control capacitance values in a tank circuit of the DCO. When each control signal is provided as an input into the DCO, the DCO resonance characteristics are altered to cause the DCO to generate a corresponding phase modulated signal in accordance with the phase values.

In some implementations, a tank circuit (or, a resonant circuit) of the DCO may include multiple capacitors in the form of multiple capacitor banks, where capacitors in each respective capacitor bank may be selectively turned on and off to obtain a desired frequency out of the DCO. Such solutions have been adequate for use is relatively low speed communication systems.

Due to the high modulate rates of modern communication systems, there is a need for modulators that have a very wide bandwidth and very low output distortion. Accordingly, a need exists for oscillators with improved characteristics.

BRIEF DESCRIPTION OF THE SEVERAL VIEWS OF THE DRAWINGS

The accompanying figures, where like reference numerals refer to identical or functionally similar elements throughout the separate views, together with the detailed description below, serve to further illustrate embodiments of concepts that include the claimed invention, and explain various principles and advantages of those embodiments.

FIG. 7 illustrates an example of the piece-wise linear N-point lookup table.

Figure 1:
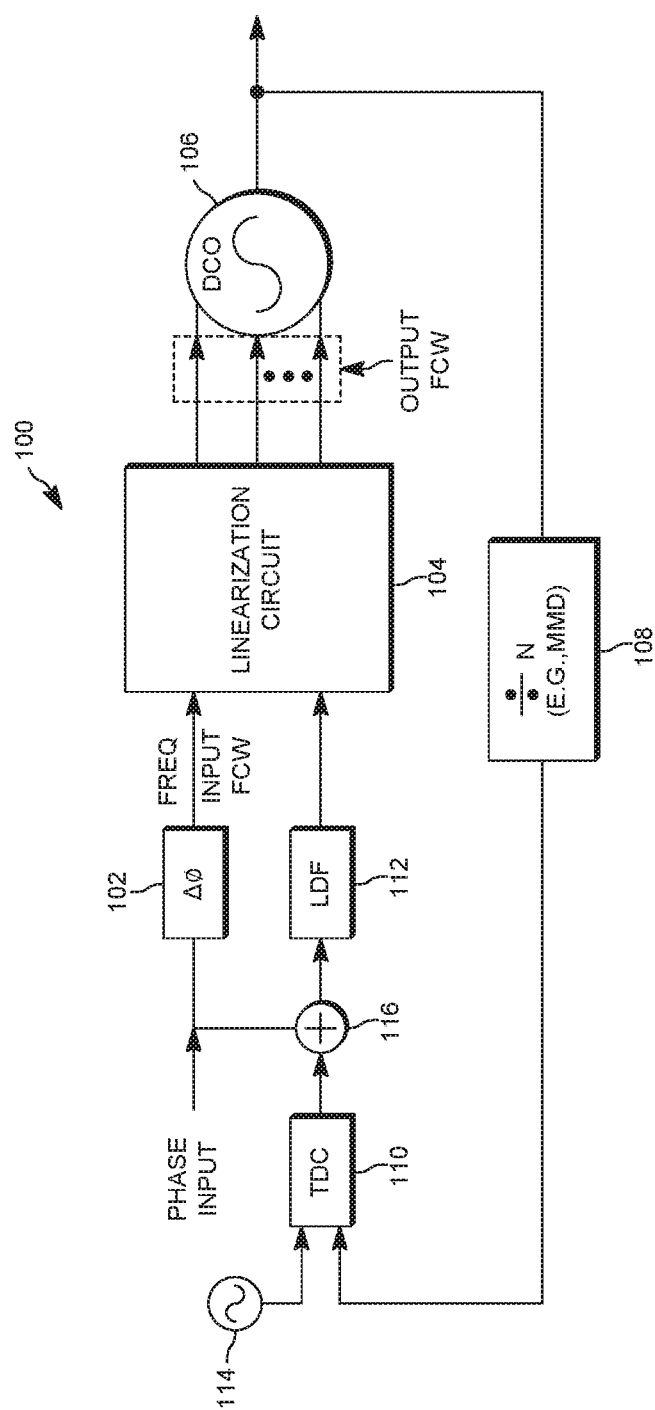
FIG. 1 is a block diagram of an example phase-locked loop modulator circuit configuration including a linearization circuit, in accordance with some embodiments

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Described herein is a method and circuit that facilitates linearizing a frequency response of an oscillator, such as a DCO. In accordance with illustrative embodiments, the present disclosure provides a linearization method and circuit for adjusting an input frequency control word (FCW) to be provided to an oscillator with a plurality of capacitor banks to compensate for non-linear behavior of the oscillator.

More specifically, in some embodiments, the linearization circuit is operative to generate a set of reference output FCWs for an associated set of frequencies. When the linearization circuit receives an input FCW generated from a modulator (referred to herein as an "ideal" FCW), it may responsively generate an output FCW based on (i) an interpolation between two reference output FCWs of the set of reference output FCWs and (ii) respective sensitivity characteristics of at least two capacitor banks of the oscillator. Further, the linearization circuit may generate an output FCW to be applied to the at least two capacitor banks of the oscillator that are digitally controlled in accordance with the output FCW. In response, the oscillator may generate an output signal with a frequency corresponding to the output FCW.

FIG. 1 is a block diagram of an example phase-locked loop circuit configuration including a linearization circuit, in accordance with some embodiments. Referring to FIG. 1, a phase-locked loop configuration 100 includes a differentiator 102, a linearization circuit 104, a digitally controlled oscillator (DCO) 106, a frequency divider 108, a time-to-digital converter (TDC) 110, a loop filter 112, and a summation element 116.

In operation, a differentiator 102 is configured to receive an input phase signal and take a time differential of the phase signal to generate a differentiated phase signal corresponding to an input frequency control word (FCW) (as denoted in FIG. 1). In illustrative embodiments, the phase signal values provided to the differentiator 102 may be an N-bit phase codewords covering a wrapped phase signal φ(n) in the range of (−π, π] (or equivalently [0, 2π)). In this regard, the phase codewords may be divided equally among that range, resulting in $2^N$ digital phase values. The phase values may be provided from a CORDIC circuit used to convert in-phase and quadrature signals (I/Q) generated from a signal mapper with a modulator.

In some embodiments, the differentiator 102 may operate by generating a difference between two sequential phase codewords. To illustrate, the differentiator 102 may operate by subtracting a previous value of the phase signal from a current value of the phase signal. As an example, in some embodiments, the differentiator may be implemented by a two-tap filter representing a simple difference equation, such as f[n]=x[n]−x[n−1]. In other embodiments, the differentiator 102 may be configured in other ways.

In illustrative embodiments, the frequency values output by the differentiator 102 may be in the form of N-bit digital codewords, or more specifically input FCWs (e.g., 18-bit FCWs) that, ideally, correspond to the differentiated phase values for controlling the DCO 106 so as to generate an output signal with a desired frequency. As is known, altering a phase of a carrier signal may be performed by causing deviations in the frequency around the carrier. The input FCW is then provided to the linearization circuit 104 that is operative to adjust the input FCW and produce an output FCW (as denoted in FIG. 1) that is applied to the DCO 106. Although not shown in detail in FIG. 1, the DCO 106 includes a tank circuit having multiple capacitor banks that are digitally controlled in accordance with the output FCW provided out of the linearization circuit 104.

Figure 10:
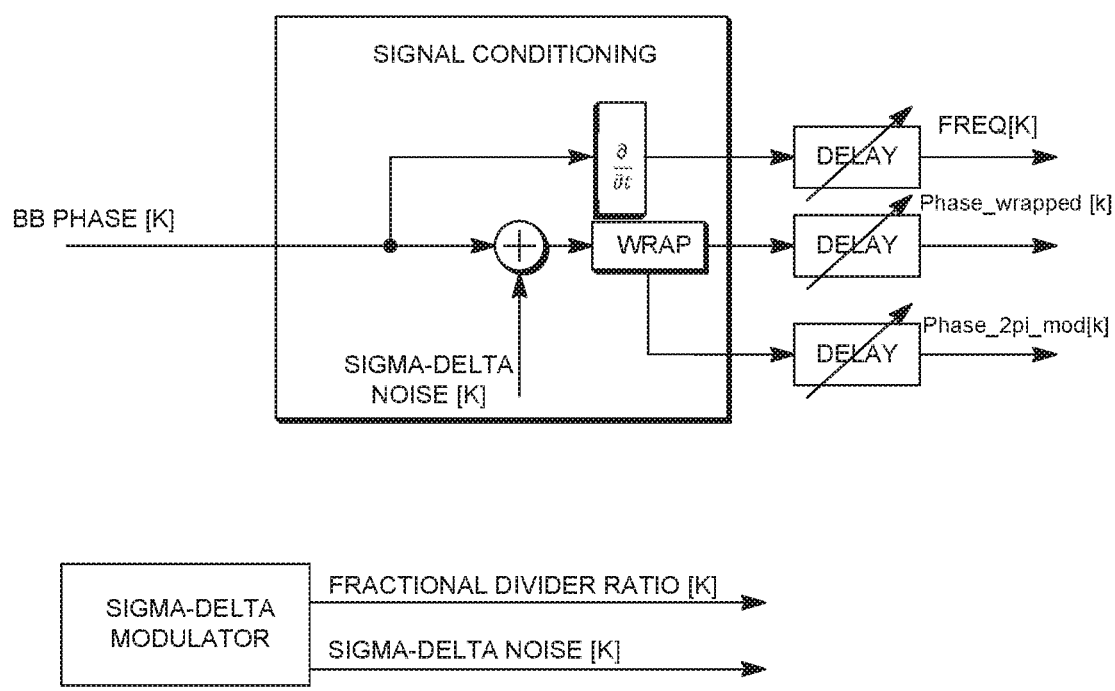
FIG. 10 is a block diagram of the phase signal processing for the modulator circuit.

As further illustrated in FIG. 1, an oscillating signal with a desired frequency may be generated by the DCO, where the frequency is determined by reactive components within the DCO, which are in turn controlled by the FCW. The FCW may include multiple inputs each carrying a fractional portion (or a set of bits) of the output FCW that respectively controls an associated capacitor bank in the multiple capacitor banks of the DCO 106. As further shown in FIG. 1, a number of inputs into the DCO 106 may vary based on a number of capacitor banks in the DCO's tank circuit. The oscillator output signal is fed back to a frequency divider 108, which divides the frequency of the oscillating signal by a frequency divisor N to generate a frequency-divided signal. In some embodiments, the frequency divider 108 is a multi-modulus frequency divider (MMD), with the frequency divisor N being controlled by frequency divider control logic, that is driven by the summation of the fractional divider ratio [k] plus the Phase_2pi_mod[k] signals as shown in FIG. 10. A multi-modulus frequency divider may be implemented using, for example, a cascaded chain of frequency divider sections. The divisor N may be an integer divisor or may be a fractional divisor. In some embodiments, the multiple modulus divider is dynamically adjusted to account for the occurrence of phase jumps in the phase-wrapped input signal, such that a 2π phase error will be injected and measured by the TDC to fully offset, or cancel, a 2π phase jump in the phase-wrapped input. Incorporated herein by reference is U.S. Pat. No. 9,391,625, entitled "Wideband Direct Modulation with Two-Point Injection in Digital Phase Locked Loops", issued Jul. 12, 2016.

Additionally, the phase-locked loop configuration 100 includes a reference oscillator 114, which may provide a reference signal (e.g., a clock signal) as an input to a time-to-digital converter (TDC) 110 operative to compare a phase of the frequency-divided signal out of the frequency divider 108 with a phase of the cyclic reference signal to generate a measured phase signal. The time-to-digital converter 110 may operate by, for example, measuring an elapsed time between a rising edge of the frequency-divided signal and a rising edge of the reference signal.

The phase-locked loop configuration 100 also includes a summation element 116, which may be an adder operating on the wrapped-phase input signal. In some embodiments, the summation element 116 operates to inject the wrapped-phase input signal into the feedback loop. In particular, the summation logic 116 is operative to sum the wrapped-phase input signal with the measured phase signal to generate an error signal. The error signal represents a difference between the phase of the oscillating signal from the DCO 106 and the wrapped-phase input signal. When the signal from the DCO 106 has a phase equal to the phase indicated by the wrapped-phase input signal, the error signal is substantially equal to zero. When the signal from the DCO 106 has a phase different from the phase indicated by the wrapped-phase input signal, the error signal contributes to a control signal that controls the DCO 106.

As shown in FIG. 1, the error signal is filtered by a loop filter 112, which may be a digital proportional-integral (PI) filter, to generate a filtered error signal. In turn, the filtered error signal is provided as an input to the linearization circuit 104. As noted above, in some embodiments, the filtered error signal contributes to a control signal that controls the DCO 106. Namely, as will be described later in further detail, in some embodiments, the filtered phase error signal will contribute to at least a portion of the output FCW generated by the linearization circuit in order to control a frequency of oscillation of the DCO 106.

Due to a non-ideal behavior of an oscillator, such as the DCO 106, a frequency response of the DCO may be non-linear. More specifically, the non-linearity in the DCO frequency response may arise due to non-ideal behavior of capacitors in capacitors banks in a tank circuit of the DCO 106.

Figure 2:
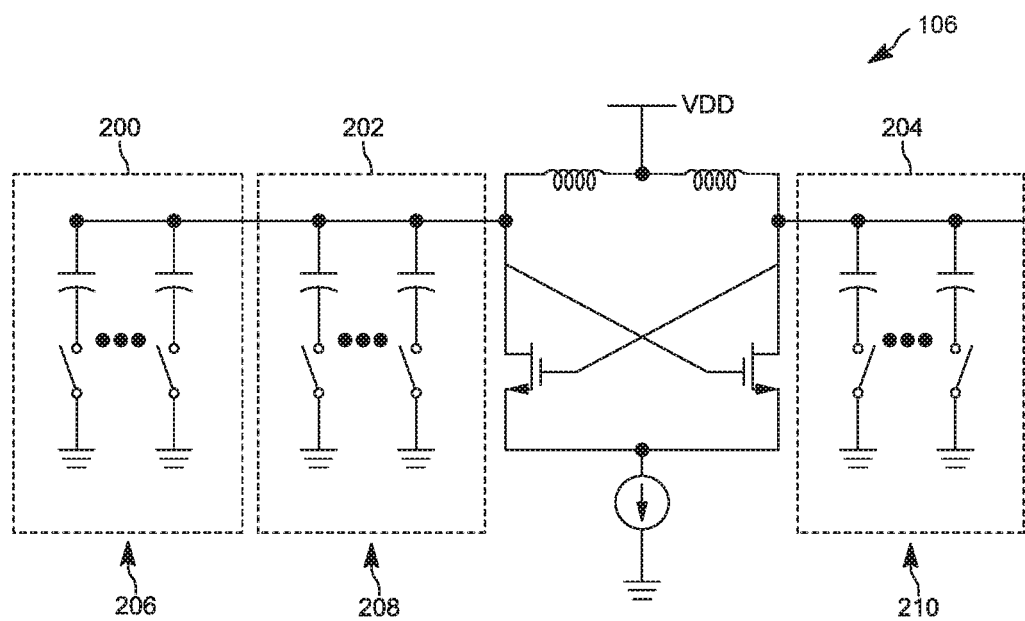
FIG. 2 illustrates one example structure of the DCO of FIG. 1, in accordance with some embodiments.

FIG. 2 illustrates one example structure of the DCO of FIG. 1, in accordance with some embodiments. More specifically, as shown, a tank circuit of the DCO 106 may include multiple switched capacitor banks 200-204 each comprising a respective plurality of capacitors and providing a variable capacitance. In this regard, a respective set of bits of an FCW applied to the capacitor banks may be used to selectively control the plurality of capacitors of the capacitor bank, such via control inputs 206-210.

Figure 3:
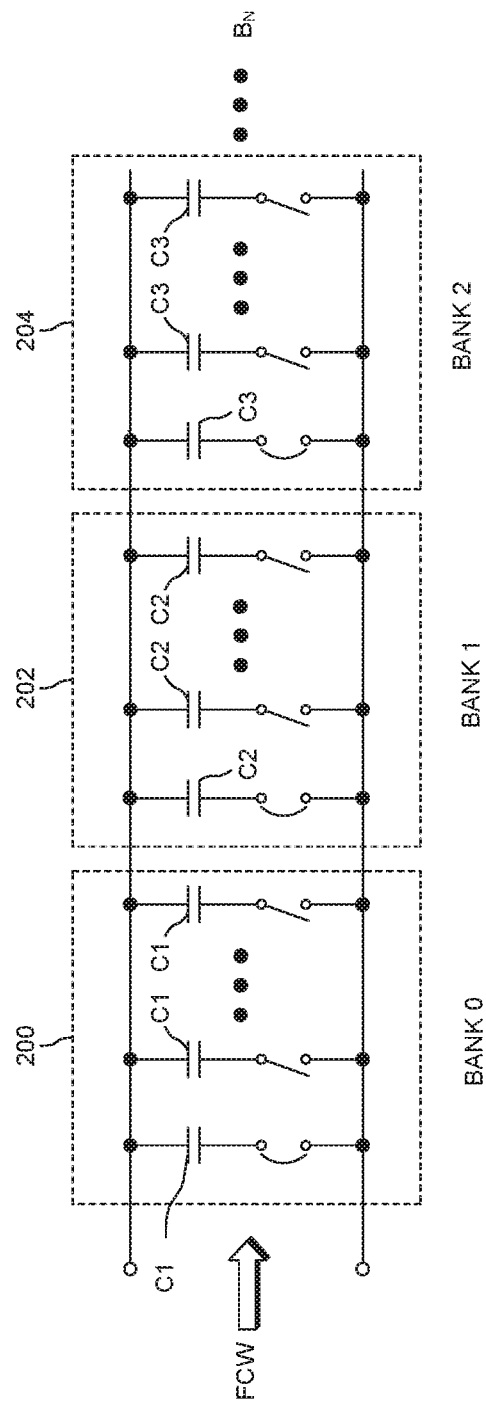
FIG. 3 illustrates a series of capacitors banks, including the capacitor banks of FIG. 2, in greater detail.

Namely, in the embodiment of FIG. 2, each set of bits associated with a given capacitor bank may be applied to the gates of transistors within that bank to selectively place the switches in an on or off state to alter the bank's overall capacitance by activating selected capacitor(s). Note that although FIG. 2 shows three capacitor banks, in other embodiments, the DCO 106 may include only two capacitor banks or more than three capacitor banks. In some embodiments, an additional bank of capacitors may be provided to adjust the overall initial oscillatory range according to process, voltage, and temperature (PVT) variations. FIG. 3 illustrates a series of capacitors banks, including the capacitor banks of FIG. 2, in greater detail.

For instance, in some embodiments, the FCW applied to the capacitor banks 200-204 may an 18-bit control word. A set of most significant bits, which in one example is 5 bits, of the output FCW may be used to selectively change a capacitance of the first capacitor bank 200 (denoted as "Bank 0") that may contain largest-sized capacitors to provide coarse capacitance resolution. As a result, 2^5, or 32, capacitance values are possible. The next 6-bit set (or portion) of bits of the output FCW may be used to selectively change a capacitance of the second capacitor bank that may contain, e.g., medium-sized capacitors to provide intermediate capacitance resolution. As a result, 2^6, or 128, capacitance values are possible. Lastly, a 7-bit set of least significant bits of the output FCW may be used to selectively change a capacitance of the third capacitor bank 206 that may contain smallest-sized capacitors to provide fine capacitance resolution. As a result, 2^7, or 256, capacitance values are possible.

In illustrative embodiments, each capacitor bank comprises a set of capacitors that are each of a given capacitance size that varies from one capacitor bank to another capacitor bank, as shown, for example, in FIG. 3. The resonance of the DCO generally decreases with increasing capacitance according to $1/\sqrt{C}$. Different banks of capacitors may be used to tune a resonant frequency of the DCO 200. Normally, capacitors in a capacitor bank having larger-sized capacitors, such as Bank 0, will provide a largest frequency step (or, a frequency change) as each capacitor in the bank is incrementally added or removed (removal of a capacitor results in an increase in frequency). In contrast, capacitors in a capacitor bank having smallest-sized capacitors, such as Bank 3, will provide smallest frequency step (or, a frequency change) as each capacitor in the bank is successively turned on/activated, or removed. Hence, to get intermediate frequencies between largest frequency steps, medium and small-valued capacitors in the other two banks are set accordingly.

In operation, to cover an entire frequency operating range of the oscillator (e.g., a frequency range corresponding to a range of phase values from 0 to $2\pi$), capacitors in Bank 2 (i.e., capacitors with the finest capacitance resolution) may be first activated/removed. Once all the capacitors in that bank are activated, one-by-one capacitors with a bigger frequency step may be successively activated, i.e., the capacitors in Bank 1, whereupon for each increment of the capacitors in Bank 1, the capacitors in Bank 2 are reset to zero and then successively activated. Once all of the caps in Bank 1 are exhausted, capacitors with the largest frequency step may be successively activated, each time restarting the cycle of incremental increases of Bank 1 and Bank 2. Note also that the DCO may be configured to provide a desired bandwidth according to the desired phase change, according to:

desired_phase_change=$2\pi$*DCO_freq_excursion* time_at_that_frequency, which, in one embodiment where a desired phase change in 1 clock cycle, would yield:

desired_phase_change=$2\pi$*DCO_freq_excursion*$\frac{1}{160}$ MHz=$2\pi$*DCO_freq_change*6.25 ns.

Thus, for a change of $\pi$, we have $2\pi$*80 MHz*6.25 ns=$\pi$.

Those skilled in the art will appreciate that each binary code word may be converted to a corresponding thermometer code to facilitate selection of each additional capacitor in a given bank one by one. In general, in thermometer coding, the number of "1" bits add up to a number counted. Hence, for each code word change, a corresponding thermometer code would change by an additional "1" bit.

However, due to non-ideal behavior of capacitors in a given capacitor bank of an oscillator, each capacitor bank will typically have a respective slope, or sensitivity characteristic that indicates how that capacitor bank responds to an incremental addition of capacitors in that bank. Namely, the respective sensitivity characteristic of the capacitor bank indicates a change in a frequency of the oscillator that occurs as a result of an incremental addition of each capacitor in the capacitor bank, or a change in frequency in response to an incremental bit change in a control word controlling that particular capacitor bank.

In other words, the respective sensitivity characteristic of the capacitor bank indicates a change in the frequency of the oscillator in response to an incremental bit change in a set of bits of an FCW applied to the bank of the oscillator. The respective sensitivity characteristic of the capacitor bank is a value corresponding to a frequency value indicating a change in frequency (or delta (Δ) frequency) per capacitor removed.

Figure 4:
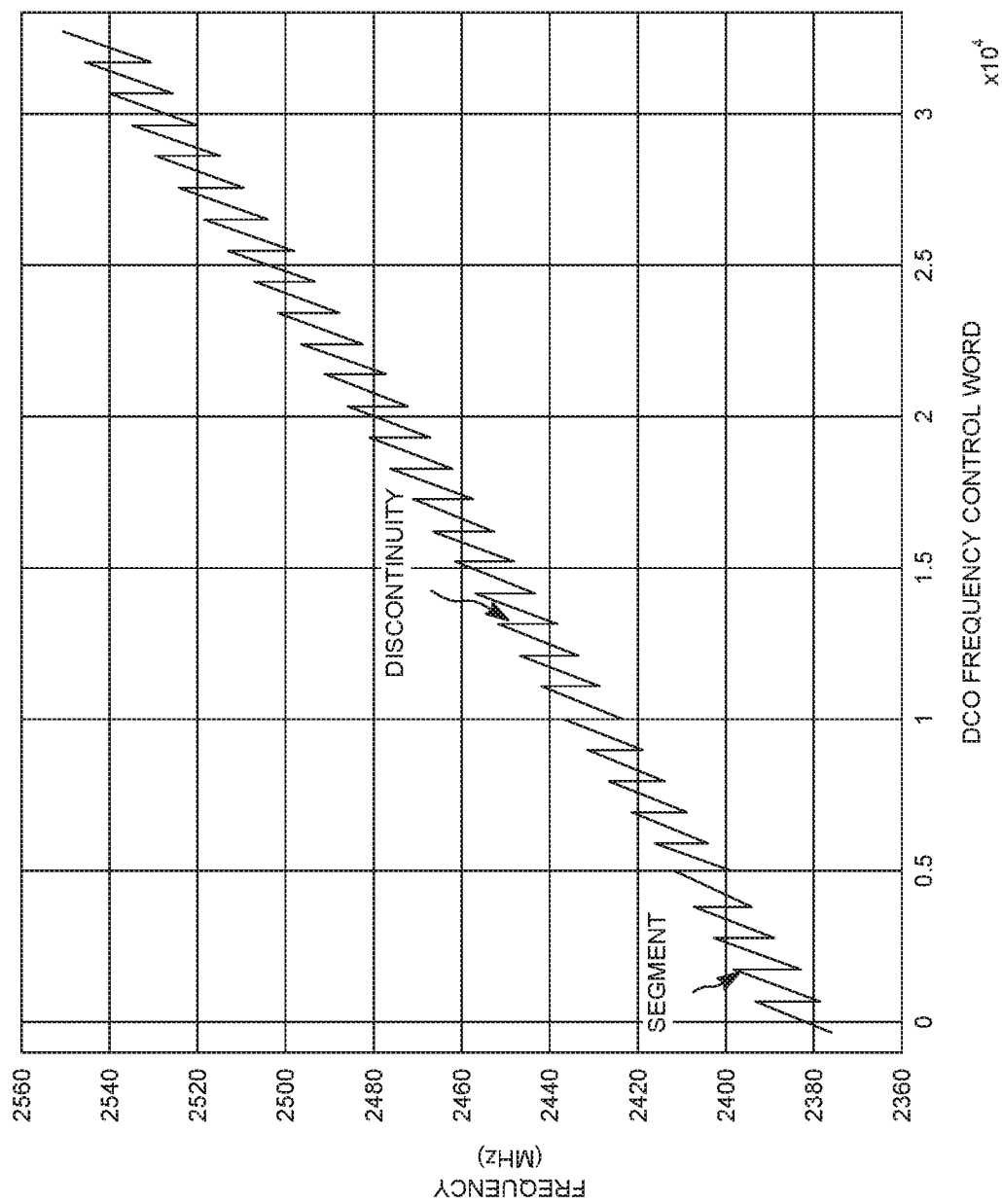
FIG. 4 illustrates an example of a plot of a frequency response of a DCO in response to a frequency control word that is not linearized.

Given that each capacitor bank may have its own sensitivity characteristic, an output frequency response of a DCO, such the DCO 106, will typically be non-linear as capacitors in respective capacitor banks are selectively removed (increasing frequency) or added (decreasing frequency). FIG. 4 illustrates an example of a plot of a frequency response of a DCO in response to a frequency control word that is not linearized.

In this example, the FCW may be an 18-bit FCW, where, e.g., 5 most significant bits of the FCW may be used to change a capacitance of a capacitor bank with largest-sized capacitors, such as Bank 0 in FIG. 3. Although not shown in detail, each line segment (as denoted in FIG. 4) includes finer frequency steps obtained using additional capacitor banks, such as Banks 1 and 2 of FIG. 3 controlled by a remainder of the 18-bit FCW (i.e., 13 bits). On the other hand, each falling edge (or discontinuity, as denoted in FIG. 4) indicates a change in frequency response with an incremental addition (or removal) of each capacitor the capacitor bank with the largest-sized capacitors, such as Bank 0, coupled with resetting/setting of the capacitors in the next finer bank.

Figure 5:
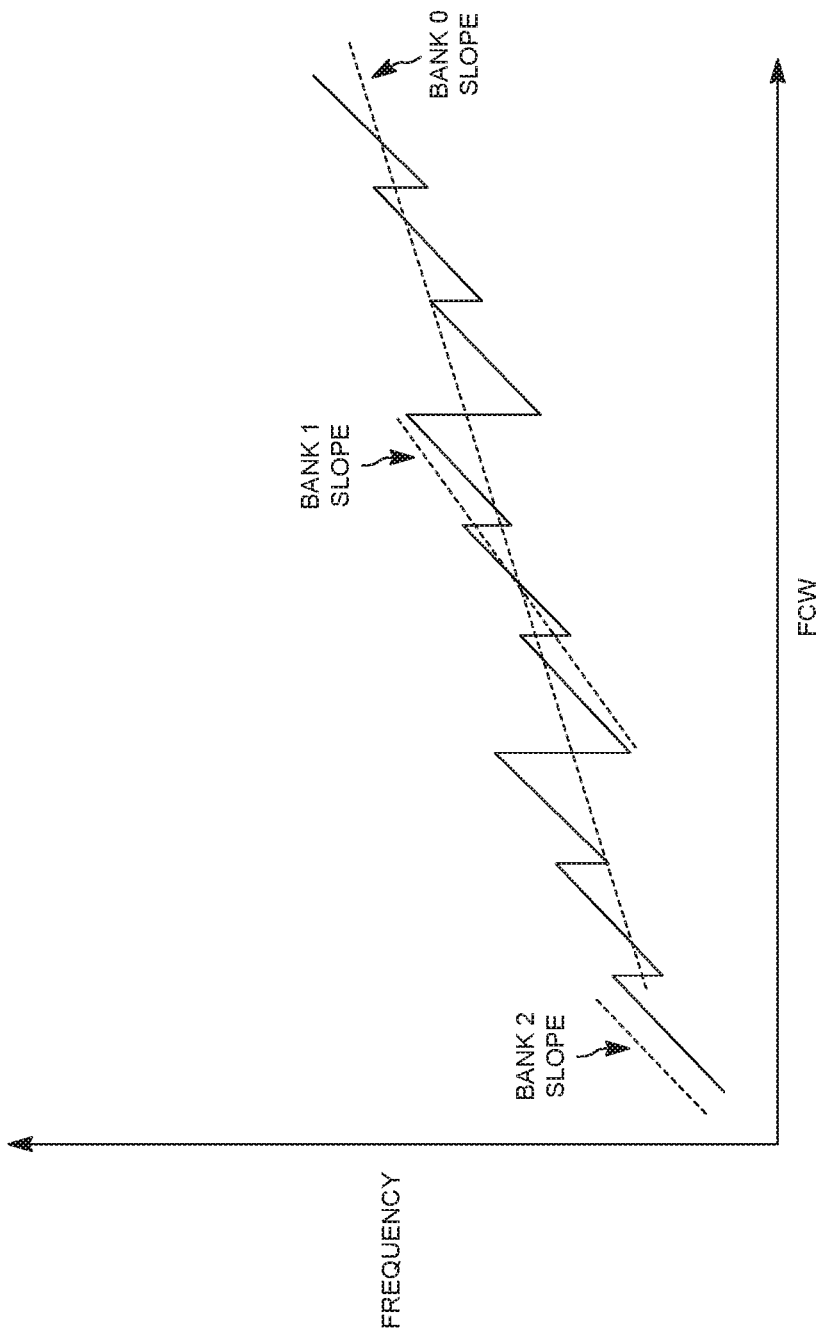
FIG. 5 illustrates an example of a portion of the plot of FIG. 4 in greater detail, in accordance with some embodiments.

FIG. 5 then illustrates an example of a portion of the plot of FIG. 4 in greater detail. More particularly, FIG. 5 shows an example of non-linearities that may arise in the DCO output frequency as a result of different sensitivity characteristics (slopes of frequency responses) of respective capacitor banks, such as Banks 0-2 in FIG. 3. Further, FIG. 5 shows the respective sensitivity characteristics (slopes) associated with each respective capacitor bank.

Figure 6:
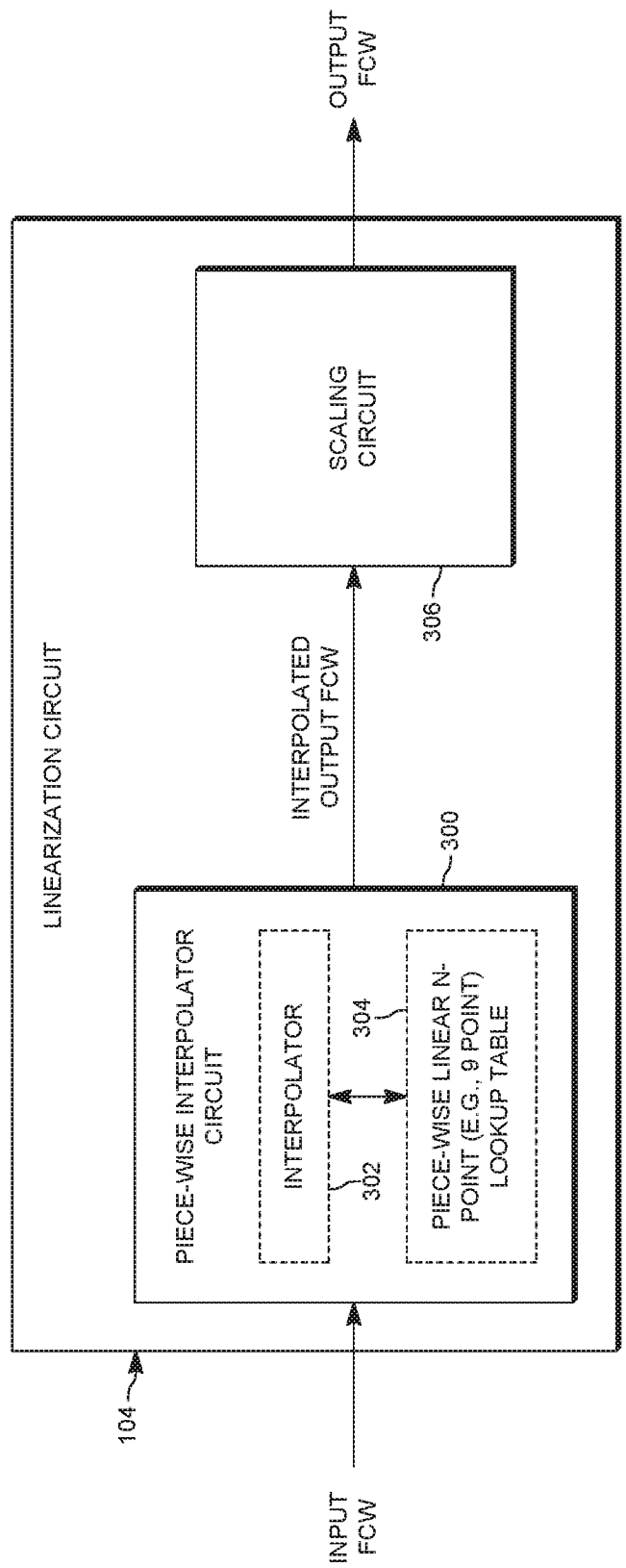
FIG. 6 is a block diagram of the linearization circuit of FIG. 1, in accordance with some embodiments.

As discussed above, in illustrative embodiments, a linearization circuit is provided to adjust an input FCW to be applied to capacitor banks of an oscillator to substantially linearize a frequency response of the oscillator. FIG. 6 is a block diagram of the linearization circuit of FIG. 1, in accordance with some embodiments.

As shown in FIG. 6, in some embodiments, linearization circuit 104 includes a piece-wise interpolation circuit 300 and a scaling circuit 306. The piece-wise linearization circuit 300 further includes an interpolator 302 and a piece-wise linear N-point lookup table (LUT) 304. As illustrated in FIG. 6, the linearization circuit 104 receives an input FCW (such as an input FCW out of the differentiator 102 in FIG. 1) and provides an output FCW to be applied to an oscillator (such as the DCO 106 in FIG. 1).

In operation, the piece-wise linear N-point lookup table 304 in the piece-wise interpolation circuit 300 stores a set of N points that associate N reference output FCWs with a set of frequencies of an oscillator. More specifically, in some embodiments, the LUT 304 is determined using a calibration process that may involve a measurement of a frequency response of an oscillator based on an adjustment of the actual capacitor settings in capacitor banks of the oscillator. In some embodiments, the actual non-linearized frequency response of the oscillator may be measured using a frequency counter.

In some embodiments, to determine the set of reference output FCWs for the associated set of frequencies of the oscillator, the calibration process may involve: (i) selecting a number of desired frequencies, and (ii) for each selected desired frequency of the oscillator: (a) providing an initial FCW (e.g., an 18-bit FCW) to the oscillator and thereafter adjusting the initial FCW by selectively setting capacitance values of multiple capacitor banks of the oscillator so as to cause the oscillator to generate approximately the desired frequency, and (b) setting the adjusted initial FCW as a reference output FCW associated with that desired frequency.

In this regard, the initial FCW corresponds to an "ideal" input FCW, or an input FCW that ideally corresponds to a desired frequency of the oscillator assuming a linear behavior of the oscillator. The initial FCW may be adjusted by searching out a control word that, when applied to the actual capacitor banks of the oscillator, substantially results in a frequency associated with the "ideal" input FCW. In some embodiments, the number of desired frequencies may be determined by dividing, e.g., an operating frequency range of the oscillator into equal segments defined by N points. In one illustrative embodiment, the number (N) of points may be nine (9) points.

Note, however, that although the above-described embodiment assumes equally-spaced set of frequencies, in other embodiments, a desired frequency range may be divided into segments that are not equally spaced. In this regard, some frequency ranges may be determined to be more sensitive or non-linear than others. Hence, it may be desirable to provide additional frequency points that are more closely spaced, etc. As such, more than 9 points may be used. In some embodiments, the ranges may be smaller in areas where the most non-linearity is observed.

FIG. 7 illustrates an example of the piece-wise linear N-point lookup table of FIG. 6. As shown in FIG. 7, the table 304 may store variables including "Desired Frequency", "Initial FCW", "and "Reference Output FCW." Alternatively, the Desired Frequency and Initial FCW may be implicitly determined according to the structure or addressing of the table, rather than explicitly stored values. As explained above, the "Initial FCW" corresponds to an "ideal" input FCW, or an input FCW that ideally corresponds to a desired frequency of the oscillator assuming a linear behavior of the oscillator. On the other hand, the "Reference Output FCW" corresponds to the initial FCW adjusted such as to substantially cause the oscillator to output the desired frequency associated with the "ideal" input FCW.

As further shown in FIG. 6, the linearization circuit 300 also includes an interpolator 302. In operation, once an input FCW is applied to the piece-wise interpolation circuit 300, the interpolator 302 may be configured (i) to determine which two reference output FCWs the input FCW falls in between, and (ii) to generate an interpolated output FCW. In some embodiments, the interpolated output FCW may be calculated by the interpolator 302 as a weighted sum of those two reference output FCWs. As one example, depending on how far the interpolated output FCW is from each of the two reference output FCWs, the interpolated output FCW may be, for instance, calculated as a weighted sum in the form of: X % of reference output FCW1 and Y % of reference output FCW2. The use of "%" is easily interpreted according to the binary value of the input FCW, or portion thereof between the two stored points. However, in other embodiments, it may be possible to determine the interpolated output FCW in other way(s).

In some embodiments, the interpolated output FCW may be further provided to the scaling circuit 306. As discussed above, multiple capacitor banks in a tank circuit of an oscillator will typically have different sensitivity characteristics, thus resulting in a non-linear frequency response of the oscillator. When an interpolated output FCW has a remainder portion of bits that correspond to a capacitance resolution (frequency steps) that is finer than what a single capacitor bank can produce, the systems and methods described herein use at least one other capacitor bank that can provide smaller frequency steps. However, another capacitor bank(s) will have different sensitivity characteristic(s). As such, the remainder of bits of the interpolated output FCW needs to be scaled, or normalized, accordingly by the scaling circuit 306.

As discussed above, the piece-wise linear N-point LUT 304 may be determined via a calibration process that uses an actual oscillator frequency response. Similarly, in some embodiments, a sensitivity characteristic of each of multiple capacitor banks may be measured during such calibration process to determine how each bank responds to an incremental addition of capacitors in that bank.

In some embodiments, the scaling circuit 306 (or another element not shown in FIG. 6) may be configured to determine a respective sensitivity characteristic of an individual capacitor bank (e.g., a sensitivity characteristic of any of Banks 0-2, as shown, e.g., in FIG. 3). As a general manner, a sensitivity of each capacitor bank may be determined by selectively measuring two frequency points in response to respective FCWs applied to the capacitor bank.

More specifically, the respective sensitivity may be determined by measuring two frequencies of an oscillator by turning on (i) a first number of capacitors in the capacitor bank to measure one frequency and then (ii) turning on a second number of capacitors in that capacitor bank to measure another frequency. The sensitivity characteristic of the capacitor bank may be then determined based on a difference between the two frequencies and a difference between the first and second number of capacitors.

By way of example, the capacitor bank may be set in the middle of its operating range (such as by turning on half of the capacitors of the bank). Subsequently, the FCW may be increased by five (5) turning off 5 additional caps to shift a frequency lower to measure freq1, and then the FCW may be incremented by 10 (about five FCWs higher from the mid-point) to measure freq2. A frequency change (or delta) is then (freq2-freq1)/10. The result of this calculation would provide a slope, or sensitivity characteristic expressed in terms of a frequency value per capacitor for that particular bank.

In some embodiments, other remaining capacitor bank(s) of the oscillator may be similarly set in the middle of their operating ranges to take into account the non-ideal frequency response due to those capacitor banks.

Further, in some other embodiments, multiple sensitivity characteristics of a particular capacitor bank may be determined, such as in different frequency segments of an oscillator's operating range. In this case, when an input FCW is provided to the linearization circuit 104, and an interpolated FCW may be found within a given frequency output segment as described above and a given sensitivity characteristic that corresponds to that frequency segment may be used during a scaling process performed by the scaling circuit.

Figure 8:
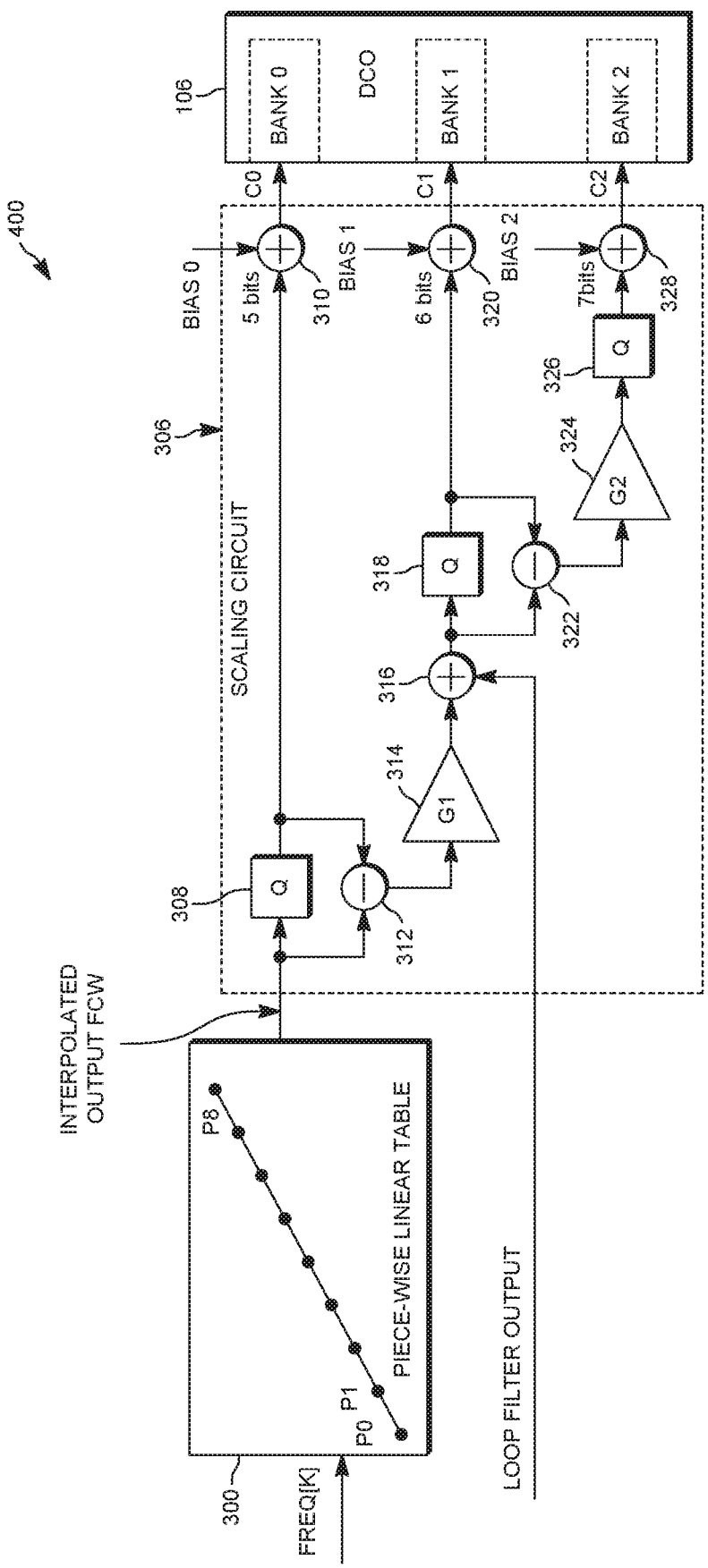
FIG. 8 illustrates one circuit implementation showing further details of the configuration and operation of the linearization circuit of FIG. 6, in accordance with some embodiments.

FIG. 8 illustrates one circuit implementation showing further details of the configuration and operation of the linearization circuit of FIG. 6, in accordance with some embodiments.

As shown in FIG. 8, a circuit 400 includes the linearization circuit 104 including the piece-wise interpolation circuit 300 and the scaling circuit 306. Further, an output of the linearization circuit 104 is applied to the DCO 106 in the form of multiple inputs each carrying a fractional portion (or a set of bits) of the output FCW that respectively controls an associated capacitor bank in the multiple capacitor banks of the DCO 106.

As shown in FIGS. 2 and 3, the DCO 106 includes three capacitor banks Bank 0, Bank 1, and Bank 2 having different sensitivity characteristics and being controlled respectively controlled by 5-bit, 6-bit, and 7-bit fractional portions of the FCW applied to the DCO 106. However, as discussed above, a number of inputs into the DCO 106 may vary based on a number of capacitor banks in the DCO's tank circuit.

As shown, in FIG. 8, an input FCW (expressed in a frequency domain as Freq[k]), which in the present example, may be 18-bit long, is transmitted into the piece-wise interpolation circuit 300, which may responsively output an interpolated output FCW as described above. The interpolated output FCW is also 18-bits long.

As a general matter, in some embodiments, once processed by the linearization circuit 104, the output FCW applied to at least two capacitors banks of oscillator, such as the DCO 106 in FIG. 1, includes a first set of bits corresponding to the most significant bits of an interpolated output FCW and at least one second set of bits determined using a remainder of bits of the interpolated output FCW.

In some embodiments, each second set of bits corresponds to a set of bits obtained by at least scaling the remainder of bits of the interpolated output FCW in accordance with sensitivity characteristics of respective capacitor banks of the at least two capacitor banks. In this regard, in some embodiments, a given second set of bits is based on (i) a set of bits obtained by scaling the remainder of bits of the interpolated output FCW in accordance with sensitivity characteristics of respective capacitor banks of the at least two capacitor banks and (ii) a phase error signal generated based on an output signal of the oscillator.

The above-noted embodiments will now be described in more detail. In general, the most significant bits of the interpolated output FCW are multiple bits used to change a capacitance of a capacitor bank, in this case the Bank 0, that includes largest-sized capacitors.

As shown in FIG. 8, in some embodiments, however, the most significant bits may be further quantized by a quantizer 308, which functions to strip off a set of bits (i.e., 5 bits as shown in FIG. 8) controlling an associated capacitor bank and round up or down a value of the stripped bits.

More particularly, in one embodiment, the output of the quantizer may be determined as:

$$acq\_q = \text{round}(pw1\_output, \text{number of acq bits})$$

where acq_q is the output of the quantizer 308 and pw1 output is an interpolated output FCW obtained from the piece-wise interpolation as discussed. The remainder of bits, i.e., 13 bits, going down to the rest of the scaling circuit 104 may be determined as follows:

$$acq\_residue = pw1\_output - acq\_q;$$

with acq_q being the output of the quantizer, and acq_residue going down to the logic associated with the next capacitor bank, in this case the Bank 1. The acq_residue may be calculated using a subtraction element 312. Additionally, the set of 5 bits rounded by the quantizer 308 is fed into a summation element 310 (e.g., an adder) that sums the 5-bit word with a bias 0 signal to produce a final set of 5 bits applied to the Bank 0 of the DCO 106. Note that the FCW words represent a deviation frequency with respect to the carrier frequency. The DCO is configured with the carrier frequency as determined by a base FCW component set by signals bias 0, bias, 1, and bias 2.

The remaining 13 bits going down to the rest of the scaling circuit 104 represent a fractional portion of a frequency step of the Bank 0. i.e., a portion controlled by smaller-resolution capacitors in other two capacitor banks, the Bank 1 and the Bank 2.

However, given that the next adjustment made in an attempt to arrive at a desired DCO frequency will involve setting of lower bits between frequency steps of the Bank 0 (i.e., Bank 0 steps are too coarse, hence a need to use bank(s) with smaller caps), a slope, or sensitivity characteristic, of that capacitor bank (or the bank with largest-sized capacitors) must be used to correct those remaining bits.

More particularly, a remainder of bits (i.e., 13 bits) (or residue) output by the element 312 is passed down to a logic associated with the next smaller-sized capacitor bank. To properly interpolate the remaining bits (i.e., those bits left after stripping off the five most significant bits), the remainder of the output FCW is first normalized by multiplying the remainder of bits by a gain element G1 314 that represents the following ratio:

$$G1 = \text{Sensitivity Characteristic of Bank 1/Sensitivity Characteristic of Bank 0}$$

In other words, this normalization is performed by dividing the remainder of bits by the Bank 0 sensitivity characteristic (or slope of its frequency response, referred to as G0, which may be measured during calibration) to remove its effect and then multiplying the result by the sensitivity characteristic of the next capacitor bank, which in the present example, is a Bank 1 sensitivity characteristic. In general, this calculation provides actual capacitance values properly interpolated according to the Bank 1 slope.

With respect to the bits controlling capacitors in the Bank 1, in some embodiments, a result output by the G1 element 314 may be further fed into a summation element 316 (e.g., an adder), which combines the normalized 13-bit remainder with the filtered error signal out of the loop filter 112, as shown in FIG. 1.

Hence, prior to being quantized by a quantizer 318, the filtered error signal generated based on the output signal of the DCO 106 is added to the scaled remainder of bits, or a second set of bits.

Note that an error signal indicating a difference in phase between a phase of the DCO and a phase of a reference signal will likely be relatively small. Hence, its contribution will need to be taken into account with respect to adjusting capacitance (and hence DCO output frequency) of capacitor banks providing finer capacitance resolution. In the embodiments shown, the phase error signal is injected so as to effect Banks 1 and 2. For example, in other embodiments, it may be possible that the error signal may contribute to a value of a portion of the output FCW that controls only Bank 2 providing only finer capacitance resolution to control frequency output accordingly.

The result output by the summation element 316 is fed into the quantizer 318, which functions to strip off a set of bits (i.e., 6 bits as shown in FIG. 8) controlling an associated capacitor bank and round up or down a value of the stripped bits. A summation element 320 (e.g., an adder) and a subtraction element 322 may operate in the same way as described in connection with the Bank 0 of the DCO 106.

The remaining 7 bits out of the subtraction element 322 going down to the rest of the scaling circuit 306 represent a fractional portion of a frequency step of the Bank 1, i.e., a portion controlled by smaller-resolution capacitors in the remaining Bank 2. In embodiments with a third capacitor bank made up of even finer capacitor values, such as in the present embodiment described herein, a third sensitivity characteristic or a slope of that bank's frequency response may exist. The least significant bits remaining after the interpolation and scaling of the previous capacitor bank must be first normalized to remove the slope of the Bank 1 from the interpolation of the fractional step of the Bank 1 and then the bits may be interpolated according to the slope of the Bank 2 capacitor bank.

As in the case of the Bank 1 described above, the remaining 7 bits may be multiplied by a gain element G2 324 that represents the following ratio:

G2=Sensitivity Characteristic of Bank 2/Sensitivity Characteristic of Bank 1

After normalization, the output of the G2 element 324 is fed into a quantizer 326 that may round up or down the remaining 7 bits accordingly. A summation element 328 (e.g., an adder) may operate in the same way as described in connection with other capacitor banks of the DCO 106. Note that using the outputs of the linearization circuit, the original interpolated FCW $p_i$ may be represented as:

$$p_i = c0_i + \frac{1}{G1}\left(\frac{c2_i}{c1_i} + c2_i\right),$$

where $c0_i$ is the codeword portion for Bank 0, $c1_i$ is the codeword portion for Bank 1, and $c2_i$ is the codeword portion for Bank 2.

Note that, in some embodiments, various logic associated with the linearization circuit 104 may implemented using VHSIC Hardware Description Language (VHDL) or a similar language. Those skilled in the art would be familiar on how to use such language to implement various functions described herein. However, in other embodiments, other implementations may be possible.

Figure 9:
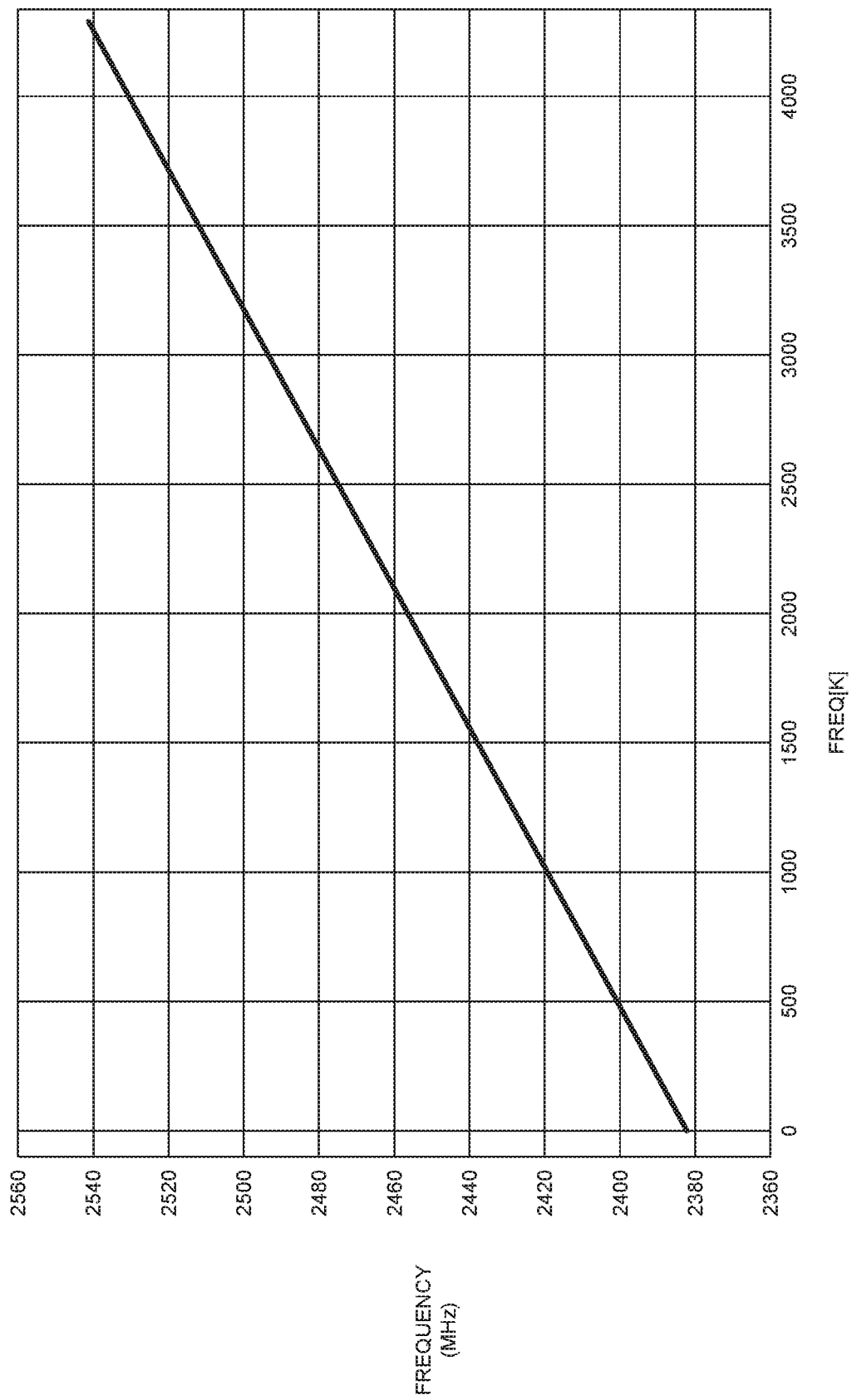
FIG. 9 illustrates a frequency response of the DCO after linearization of the FCW.

As a result of the linearization process carried out by the linearization circuit, non-linearities in a frequency response of the DCO 104 may be alleviated. Referring back to FIG. 4, a DCO frequency response was relatively non-linear due to non-ideal behavior caused at least in part by different sensitivity characteristics of multiple DCO capacitor banks and prior to a FCW input into the oscillator being linearized. In contrast, FIG. 9 is a plot showing a frequency response of a DCO as a result of processing performed by a linearization circuit of the present disclosure. As shown in FIG. 9, a FCW applied to the oscillator has been adjusted such that the frequency response of the oscillator has been substantially linearized.

FIG. 9 illustrates the linearized output behavior of the DCO. FIG. 10 depicts the phase signal processing used to generate the inputs to the linearization circuit for one particular embodiment of a DCO. Note that any DCO (even a single point injection system) may beneficially utilize the linearization system and method described herein.

Figure 11:
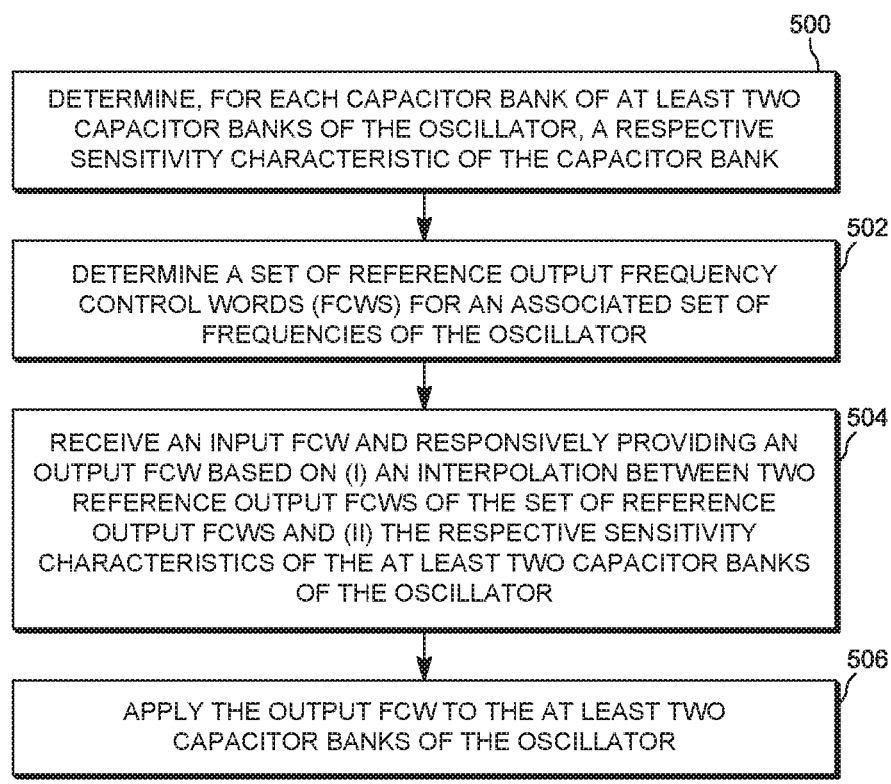
FIG. 11 is a flow diagram illustrating a method of linearizing a frequency response of an oscillator controlled by a plurality of capacitor banks, in accordance with some embodiments.

FIG. 11 is a flow diagram illustrating a method of linearizing a frequency response of an oscillator controlled by a plurality of capacitor banks, in accordance with some embodiments. Step 500 involves determining, for each capacitor bank of at least two capacitor banks of the oscillator, a respective sensitivity characteristic of the capacitor bank. Step 502 involves determining a set of reference output frequency control words (FCWs) for an associated set of frequencies of the oscillator. Further, step 504 involves receiving an input FCW and responsively providing an output FCW based on (i) an interpolation between two reference output FCWs of the set of reference output FCWs and (ii) the respective sensitivity characteristics of the at least two capacitor banks of the oscillator. Finally, step 506 involves applying the output FCW to the at least two capacitor banks of the oscillator.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of linearizing a frequency response of an oscillator controlled by a plurality of capacitor banks, comprising:
   determining, for each capacitor bank of at least two capacitor banks of the oscillator, a respective sensitivity characteristic of the capacitor bank;
   determining a set of reference output frequency control words (FCWs) for an associated set of frequencies of the oscillator;
   receiving an input FCW and responsively providing an output FCW based on (i) an interpolation between two reference output FCWs of the set of reference output FCWs and (ii) the respective sensitivity characteristics of the at least two capacitor banks of the oscillator; and,
   applying the output FCW to the at least two capacitor banks of the oscillator.

2. The method of claim 1, wherein the respective sensitivity characteristic of the capacitor bank indicates a change in a frequency of the oscillator that occurs as a result of an incremental addition of each capacitor in the capacitor bank.

3. The method of claim 1, wherein:
   each of the plurality of capacitor banks comprises a respective plurality of capacitors, and
   a respective set of bits of the output FCW is used to selectively control the plurality of capacitors of the capacitor bank.

4. The method of claim 1, wherein:
   the output FCW applied to the at least two capacitor banks of the oscillator comprises a first set of bits corresponding to the most significant bits of an interpolated output FCW and at least one second set of bits determined using a remainder of bits of the interpolated output FCW.

5. The method of claim 4, wherein each second set of bits corresponds to a set of bits obtained by at least scaling the remainder of bits of the interpolated output FCW in accordance with sensitivity characteristics of respective capacitor banks of the at least two capacitor banks.

6. The method of claim 5, wherein a given second set of bits is based on (i) a set of bits obtained by scaling the remainder of bits of the interpolated output FCW in accordance with sensitivity characteristics of respective capacitor banks of the at least two capacitor banks and (ii) a phase error signal generated based on an output signal of the oscillator.

7. The method of claim 4, wherein the most significant bits of the interpolated output FCW are multiple bits used to change a capacitance of a given capacitor bank from among the at least two capacitor banks that includes largest-sized capacitors.

8. The method of claim 4, wherein the most significant bits correspond to the most significant bits of the interpolated output FCW that are further quantized.

9. The method of claim 6, wherein:
   the at least two capacitor banks of the oscillator are a first capacitor bank and a second capacitor bank,
   the output FCW applied to the at least two capacitor banks of the oscillator comprises a first set of bits corresponding to the most significant bits of the interpolated output FCW and a second set of bits corresponding to the least significant bits of the interpolated output FCW that are at least scaled by a ratio of respective sensitivity characteristics of the first capacitor bank and the second capacitor bank,
   the first set of bits is applied to the first capacitor bank, and
   the second set of bits is applied to the second capacitor bank.

10. The method of claim 9, wherein:
    the first set of bits corresponding to the most significant bits of the interpolated output FCW is quantized prior to the first set of bits being applied to the first capacitor bank, and
    a phase error signal generated based on an output signal of the oscillator is added to the scaled second set of bits prior to the second set of bits being applied to the first capacitor bank.

11. The method of claim 9, wherein;
    the first capacitor bank comprises a first plurality of capacitors,
    the second capacitor bank comprises a second plurality of capacitors,
    the most significant bits of the interpolated output FCW are bits used to selectively control the first plurality of capacitors of the first capacitor bank, each of the first plurality of capacitors having a capacitance value larger than a capacitance value of each of the second plurality of capacitors of the second capacitor bank, and
    the least significant bits of the interpolated output FCW are the remainder of bits of the interpolated output FCW that are scaled by the ratio to selectively control the second plurality of capacitors of the second capacitor bank.

12. The method of claim 1, wherein determining, for each capacitor bank of the at least two capacitor banks of the oscillator, the respective sensitivity characteristic of the capacitor bank comprises:
    measuring first and second frequencies of the oscillator by turning on (i) a first number of capacitors in the capacitor bank to measure the first frequency and (ii) a second number of capacitors in the capacitor bank to measure the second frequency; and determining the respective sensitivity characteristic of the capacitor bank based on a difference between the first and second frequencies and a difference between the first and second number of capacitors.

13. The method of claim 1, wherein determining the set of reference FCWs for the associated set of frequencies of the oscillator comprises:
   selecting a number of desired frequencies of the oscillator;
   for each desired frequency of the oscillator:
      providing an initial FCW to the oscillator and thereafter adjusting the initial FCW by selectively setting capacitance values of the at least two capacitor banks of the oscillator so as to cause the oscillator to generate approximately the desired frequency; and
      setting the adjusted initial FCW as a reference output FCW associated with the desired frequency.

14. The method of claim 1, wherein each of the reference output FCW, the input FCW, and the output FCW is 18-bit long.

15. A circuit comprising:
   an oscillator circuit, wherein the oscillator circuit includes a tank circuit having a plurality of capacitor banks, wherein each capacitor bank of at least two capacitor banks of the oscillator has a respective sensitivity characteristic; and
   a linearization circuit coupled to the oscillator circuit, wherein the linearization circuit is operative to:
      generate a set of reference output frequency control words (FCWs) for an associated set of frequencies,
      receive an input FCW and responsively generate an output FCW based on (i) an interpolation between two reference output FCWs of the set of reference output FCWs and (ii) the respective sensitivity characteristics of the at least two capacitor banks, and
      generate an output FCW to be applied to the at least two capacitor banks of the oscillator, the at least two capacitor banks of the oscillator being digitally controlled in accordance with the output FCW, wherein the oscillator is further operative to receive the output FCW and generate an output signal with a frequency corresponding to the output FCW.

16. The circuit of claim 15, wherein:
   each capacitor bank of the at least two capacitor banks includes a respective plurality of capacitors that are each of a given capacitance size, and
   the given capacitance size varies from one capacitor bank to another capacitor bank.

17. The circuit of claim 15, wherein the respective sensitivity characteristic of the capacitor bank indicates a change in a frequency of the oscillator that occurs as a result of an incremental addition of each capacitor in the capacitor bank.

18. The circuit of claim 15, wherein:
   the output FCW applied to the at least two capacitor banks of the oscillator comprises a first set of bits corresponding to the most significant bits of an interpolated output FCW and at least one second set of bits determined using a remainder of bits of the interpolated output FCW.

19. The circuit of claim 18, wherein each second set of bits corresponds to a set of bits obtained by scaling the remainder of bits of the interpolated output FCW in accordance with sensitivity characteristics of respective capacitor banks of the at least two capacitor banks.

* * * * *